(12) United States Patent  
Zagrebelny

(10) Patent No.: US 7,361,602 B1  
(45) Date of Patent: Apr. 22, 2008

(54) CMP PROCESS

(75) Inventor: Andrey Zagrebelny, Eagan, MN (US)

(73) Assignee: Cypress Semiconductor Corporation, San Jose, CA (US)

( * ) Notice: Subject to any disclaimer, the term of this patent is extended or adjusted under 35 U.S.C. 154(b) by 42 days.

(21) Appl. No.: 11/252,933

(22) Filed: Oct. 18, 2005

Related U.S. Application Data

(60) Provisional application No. 60/621,141, filed on Oct. 22, 2004.

(51) Int. Cl.
*H01L 21/461* (2006.01)
*B44C 1/22* (2006.01)
*C23F 1/00* (2006.01)

(52) U.S. Cl. .................... 438/692; 216/52; 257/E21.23
(58) Field of Classification Search ................ 438/692; 257/E21.23, E21.214; 216/38, 52
See application file for complete search history.

(56) References Cited

U.S. PATENT DOCUMENTS 6,309,276 B1 * 10/2001 Tsai et al. ...................... 451/5
6,391,781 B1 * 5/2002 Ozawa et al. ................ 438/692
6,593,208 B1    7/2003 Jin
6,950,716 B2 * 9/2005 Ward et al. .................. 700/121
2003/0168627 A1 * 9/2003 Singh et al. ................ 252/79.1

OTHER PUBLICATIONS

Abstract of: Kang, H-G., et al., "Dependence of pH, molecular weight, and concentration of surfactant in ceria slurry on saturated nitride removal rate in shallow trench isolation chemical mechanical polishing"., Japanese Journal of Applied Physics, vol. 44, No. 7A, pp. 4752-4758, (2005).
Encyclopedia of Chemical Technology, Kirk-Othmer, vol. 14, pp. 677-709, (1995).

* cited by examiner

*Primary Examiner*—W. David Coleman
(74) *Attorney, Agent, or Firm*—Evan Law Group LLC

(57) ABSTRACT

A method of forming a polished semiconductor structure comprises polishing a surface of a semiconductor structure by chemical mechanical polishing. Pressure applied to the surface is reduced during the polishing, or a rotation rate of a polishing surface relative to the surface is reduced during the polishing.

19 Claims, 1 Drawing Sheet

CMP PROCESS

CROSS-REFERENCE TO RELATED APPLICATION

This application claims priority to provisional application Ser. No. 60/621,141 entitled "SINGLE-STEP HIGH SELECTIVITY CMP PROCESS" filed 22 Oct. 2004, the entire contents of which are hereby incorporated by reference, except where inconsistent with the present application.

BACKGROUND

Chemical Mechanical Planarization or Polishing (CMP) is a method of planarizing a semiconductor structure surface. CMP is typically carried out after forming a new layer on the surface of a semiconductor structure. As the size of features on semiconductor structures decreases, and the size of the wafers the semiconductor structures are formed on increases, the uniformity of planarization, both between wafers and across each wafer, has become more important.

Formation of shallow trench isolation (STI) structures in a semiconductor structure includes CMP. As part of forming a STI structure, a nitride layer is deposited on the semiconductor structure, a trench is formed in substrate, and subsequently an oxide layer is deposited on the structure (see, for example, U.S. Pat. No. 6,593,208). CMP is then used to remove excess oxide which is above the surface plane of the nitride, leaving oxide in the trench. CMP is then used for controlled removal of a portion of the nitride, to reduce pattern density effects.

Typically, the two CMP processes are carried out on separated platens, and even separate CMP system because different chemistries, and therefore different slurry compositions, are needed for each polish. For removing excess oxide, the CMP chemistry typically has a low oxide/nitride selectivity, while the chemistry used for controlled removal of a portion of the nitride has a reduced rate of nitride removal. The slurry composition used in the latter CMP step contains cerium oxide, water, and a surfactant that reduces the removal rate of nitride, all buffered to a pH of 4 (see, for example, H.-G. Kang, et al. "Dependence of pH, Molecular Weight, and Concentration of Surfactant in Ceria Slurry on Saturated Nitride Removal Rate in Shallow Trench Isolation Chemical Mechanical Polishing" Jpn. J. Appl. Phys., Vol. 44, No. 7A (2005) pp. 4752-4758). An example of this type of slurry is EKC STI2100B™ (EKC Technology, Danville Calif., a part of DuPont).

Previous attempts to develop a single chemistry or single step CMP process with high selectivity to nitride have resulted in either a low initial removal rate of oxide, poor residual nitride control or a high number of wafer defects. Specifically, the defects seen with this approach include a pattern density defect, commonly referred to as a dip defect, shown in FIG. 1. Dip defects are the largest contributor to the total defect count, accounting for about 80-90% of the total defects. It is believed that dip defects are caused by the EKC STI2100B™ attacking field oxide locally after the first CMP step is completed.

SUMMARY

In a first aspect, the present invention is a method of forming a polished semiconductor structure, comprising polishing a surface of a semiconductor structure by chemical mechanical polishing. Pressure applied to the surface is reduced during the polishing, or a rotation rate of a polishing surface relative to the surface is reduced during the polishing.

In a second aspect, the present invention is method of forming a polished semiconductor structure, comprising polishing a surface of a semiconductor structure by chemical mechanical polishing. A concentration of a slurry polishing the surface is reduced during the polishing.

In a third aspect, the present invention is a process of forming a plurality of polished semiconductor structures, comprising polishing surfaces of a plurality of semiconductor structures by chemical mechanical polishing. The semiconductor structures each comprise (i) a substrate, (ii) a nitride on the substrate, and (iii) an oxide on the nitride. A Cpk of the process is at least 1.5.

DETAILED DESCRIPTION

Figure 1:
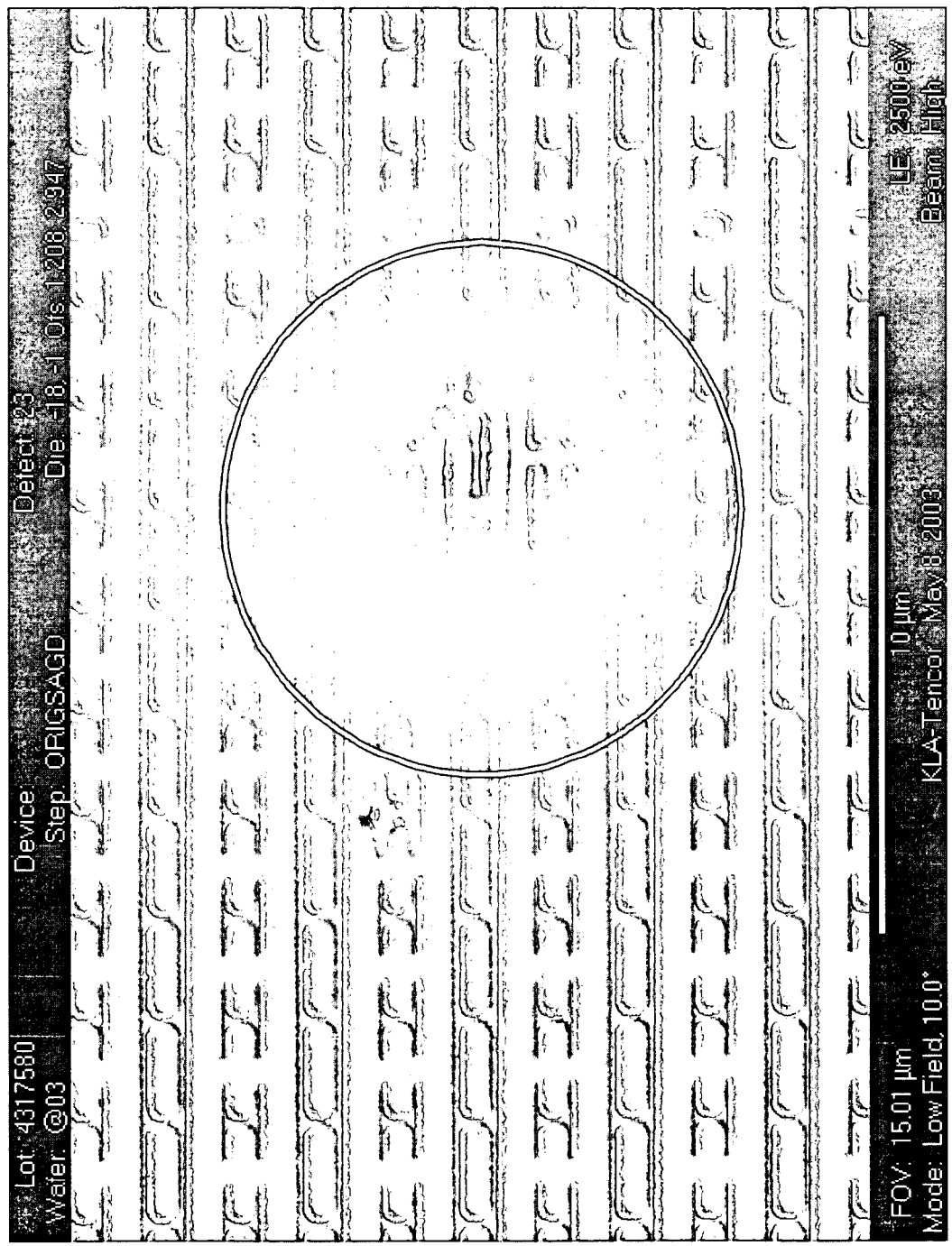
FIG. 1 is an electron microscope image of a dip defect on the surface of a wafer polished according to a conventional CMP process.

The present invention makes use of the discovery of two CMP processes. In the first process, removal of excess oxide is by CMP during which the force on the wafer applied from the carrier and the platen, and/or the rotation rate, are reduced, during the polishing. This process provides better control over the removal of nitride and reduces the occurrence of dip defects. In the second process, the polishing slurry is gradually diluted during polishing, preferably with deionized water. This second process substantially eliminates dip defects. Preferably, the two processes are used together, the first process followed by the second process. Either process, as well as both processes together, allow for a single chemistry, a single CMP system and a single platen, for the entire CMP part of formation of the STI structure, without removing the wafer from the CMP system, and without addition of a different slurry to the CMP system. The process may be carried out on a commercially available CMP system, such as a Westech AVANTI 472 two-platen polisher (CMP solutions, Phoenix, Ariz.). The polishing may be carried out with a slurry containing an abrasive, such as cerium oxide, a solvent, such as water, a buffer, and a surfactant. Commercially available slurries may be used, such as EKC STI2100B™

Prior to polishing, the substrate is on a carrier of the CMP system, a polishing slurry is on the surface of the substrate, and a polishing surface of the CMP system is opposite the surface of the substrate. Polishing of the substrate is carried out by rotating the substrate relative to the polishing surface, by rotation of the substrate (via the carrier), rotation of the polishing surface, or both. Similarly, the substrate is pressed against the polishing surface, by applying force to the substrate against the polishing surface (via the carrier), applying force to the polishing surface against the substrate, or both.

After polishing has begun, the pressure of the polishing surface against the substrate is reduced, and/or rate of rotation is reduced. Preferably, the pressure of the polishing surface against the substrate is reduced by at least 25%, more preferably at least 50%, most preferably at least 80%, for example 25-99%, or 50-95%, or 80-90%. Preferably, the rate of rotation of the substrate relative to the polishing surface is reduced by at least 10%, more preferably at least 25%, most preferably at least 45%, for example 10-95%, or 25-85%, or 50-75%.

Alternatively, after polishing has begun the slurry is progressively diluted, preferably by continuous addition of deionized water to the slurry during a portion of the polishing. Preferably, the dilution is carried out over a period of 5 seconds to 5 minutes, more preferably 10 seconds to 2 minutes, most preferably 20 seconds to 1 minute. Preferably, deionized water is added at a rate of 5-500 ml/min., more preferably 20-300 ml/min., most preferably 150-250 ml/min., including about 200 ml/min. It is also possible to reduce the pressure and/or the rotation speed during the progressive dilution, in a like manner as the previously described pressure and/or rotation speed reduction of the other process.

In a preferred embodiment, both processes are used together, with the reduced pressure and reduced rotation rate process first, followed by dilution of the slurry. The table below is an example of this preferred embodiment, carried out on a Westech 472 two-platen polisher. In the table, the first process having reduced pressure and reduced rotation rate is phase 3, while the second process using a progressively diluted slurry is phase 4. In the table, time is reported in seconds, Press. reports pressure in psi, Pump 1 reports volume of water added in ml, Pump 2 reports volume of slurry in ml, Plt. reports the rotation rate of the platen (polishing surface) in RPM, Car. reports the rotation rate of the carrier in RPM, and BP reports the backside pressure in psi.

| Name | Phase | Time | Press | Rinse | Pump 1 | Pump 2 | Plt. RPM | Car. RPM | BP |
|---|---|---|---|---|---|---|---|---|---|
| Primary | 1 | 0:05 | 2.0 | Off | 0 | 200 | 100 | 107 | 1.0 |
|  | 2 | VAR | 7.0 | Off | 0 | 200 | 100 | 107 | 2.5 |
|  | 3 | 0:15 | 5.0 | Off | 0 | 200 | 100 | 107 | 2.5 |
|  | 4 | 0:30 | 1.0 | Off | 150 | 0 | 50 | 50 | 0.5 |
|  | 5 | 0:10 | 1.0 | On | 0 | 0 | 50 | 50 | 0.5 |
| Final | 1 | 0:20 | 1.5 | Off |  | 0 | 13 | 12 | 0 |
| Pad | 2 | 0:01 | 1.5 | On |  | 0 | 13 | 12 | 0 |
|  | 3 | 0:04 | 1.5 | Off |  | 0 | 13 | 12 | 0 |
|  | 4 | 0:01 | 1.5 | On |  | 0 | 13 | 12 | 0 |

The process using a progressively diluted slurry should not be confused with a commonly used deionized water rinse step in which large quantities of water are added to the polishing platen over a short period of time in a poorly controlled way.

Optionally, the carrier further includes a retaining ring flexibly coupled thereto and disposed about the substrate held on the carrier. During the initial phase and beginning of the polishing the retaining ring is pressed against the polishing surface. During the process using a progressively diluted slurry this backing pressure may be further reduced to further reduce the occurrence of defects.

The processes of the present invention have a low sensitivity to pattern density effects and improved residual nitride control resulting in an improved process capability index (Cpk) of at least 1.5, more preferably greater than 2, versus a baseline Cpk of about 1.35 for a conventional CMP process. The Cpk number is a statistical measure of performance widely used in the semiconductor industry and is defined as:

$$Cpk = \text{minimum}[(X\text{bar}-LSL)/3\sigma; (USL-X\text{bar})/3\sigma]$$

where LSL and USL are the lower and upper specification limits (tolerances); Xbar is the calculated average of nominal values for all data points used for Cpk evaluation; and $\sigma$ is the standard deviation of the data points. A Cpk value of 1 means that each product is produced with measurements within a 95% confidence of the process tolerances. A process having a Cpk=1 is referred to as "capable." It is desirable for a process to have a Cpk value greater than 1, meaning that the product measurements are within a confidence greater than 95%.

Other processing may be used to complete formation of semiconductor devices from the semiconductor structure. For example, gate stacks and source/drain regions may be formed in the substrate, additional dielectric layers may be formed on the substrate, and contacts and metallization layers may be formed on these structures. These additional elements may be formed before, during, or after formation of the PSG film.

The related processing steps, including the etching of layers, other polishings, cleaning, and deposition steps, for use in the present invention are well known to those of ordinary skill in the art, and are also described in Encyclopedia of Chemical Technology, Kirk-Othmer, Volume 14, pp. 677-709 (1995); Semiconductor Device Fundamentals, Robert F. Pierret, Addison-Wesley, 1996; Wolf, Silicon Processing for the VLSI Era, Lattice Press, 1986, 1990, 1995 (vols 1-3, respectively), and Microchip Fabrication 4rd. edition, Peter Van Zant, McGraw-Hill, 2000.

The semiconductor structures of the present invention may be incorporated into a semiconductor device such as an integrated circuit, for example a memory cell such as an SRAM, a DRAM, an EPROM, an EEPROM etc.; a programmable logic device; a data communications device; a clock generation device; etc. Furthermore, any of these semiconductor devices may be incorporated in an electronic device, for example a computer, an airplane or an automobile.

The invention claimed is:

1. A method of forming a polished semiconductor structure, comprising:
    polishing a surface of a semiconductor structure by chemical mechanical polishing;
    wherein pressure applied to the surface is reduced during the polishing, or a rotation rate of a polishing surface relative to the surface is reduced during the polishing,
    the semiconductor structure comprises
        (i) a substrate,
        (ii) a nitride on the substrate, and
        (iii) an oxide on the nitride, and
    the polishing comprises removing excess oxide and a portion of the nitride, and
    wherein the polishing is a single step.

2. The method of claim 1, wherein pressure applied to the surface is reduced during the polishing, and the rotation rate of the polishing surface relative to the surface is reduced during the polishing.

3. A method of making a semiconductor device, comprising:
    forming a semiconductor structure by the method of claim 1, and
    forming a semiconductor device from the semiconductor structure.

4. The method of claim 2, wherein the pressure applied to the surface is reduced by at least 50%.

5. The method of claim 2, wherein a concentration of a slurry polishing the surface is reduced during the polishing.

6. A process of forming a plurality of polished semiconductor structures, comprising:
    polishing surfaces of a plurality of semiconductor structures by the method of claim 2;
    wherein the Cpk of the process is at least 2.

7. A method of making an electronic device, comprising:
   forming a semiconductor device by the method of claim 3, and
   forming an electronic device comprising the semiconductor device.

8. The method of claim 4, wherein the rotation rate is reduced by at least 25%.

9. The method of claim 8, wherein a concentration of a slurry polishing the surface is reduced during the polishing.

10. The method of claim 9, wherein the concentration is reduced over a period of 10 seconds to 2 minutes by adding water at a rate of 20-300 ml/min.

11. A method of forming a polished semiconductor structure, comprising:
   polishing a surface of a semiconductor structure by chemical mechanical polishing;
   wherein a concentration of a slurry polishing the surface is reduced during the polishing, and
   wherein the polishing is a single step.

12. The method of claim 11, wherein the semiconductor structure comprises
   (i) a substrate,
   (ii) a nitride on the substrate, and
   (iii) an oxide on the nitride, and
   the polishing comprises removing excess oxide and a portion of the nitride.

13. The method of claim 12, wherein the concentration is reduced over a period of 10 seconds to 2 minutes.

14. A method of making a semiconductor device, comprising:
   forming a semiconductor structure by the method of claim 11, and
   forming a semiconductor device from the semiconductor structure.

15. A process of forming a plurality of polished semiconductor structures, comprising:
   polishing surfaces of a plurality of semiconductor structures by the method of claim 12;
   wherein the Cpk of the process is at least 2.

16. The method of claim 13, wherein the concentration is reduced by adding water at a rate of 20-300 ml/min.

17. A method of making an electronic device, comprising:
   forming a semiconductor device by the method of claim 14, and
   forming an electronic device comprising the semiconductor device.

18. A process of forming a plurality of polished semiconductor structures, comprising:
   polishing surfaces of a plurality of semiconductor structures by chemical mechanical polishing with a first platen;
   wherein the semiconductor structures each comprise
   (i) a substrate,
   (ii) a nitride on the substrate, and
   (iii) an oxide on the nitride,
   the polishing of each structure comprises removing excess oxide and a portion of the nitride,
   the polishing of each structure is carried out without moving the structure to a second platen, and
   a Cpk of the process is at least 1.5, and
   wherein the polishing of each structure is a single step.

19. The process of claim 18, wherein the Cpk of the process is at least 2.

* * * * *